United States Patent
Chen et al.

(10) Patent No.: US 6,717,809 B2
(45) Date of Patent: Apr. 6, 2004

(54) DISPLAY CIRCUIT BOARD OF A HEAT DISSIPATION SYSTEM

(75) Inventors: Ying-Chi Chen, Taoyuan Hsien (TW); Peng-Chu Tao, Taoyuan Hsien (TW); Wen-Shi Huang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 16 days.

(21) Appl. No.: 10/212,112

(22) Filed: Aug. 6, 2002

(65) Prior Publication Data

US 2003/0227748 A1 Dec. 11, 2003

(30) Foreign Application Priority Data

Jun. 10, 2002 (TW) ...................... 91208545 U

(51) Int. Cl.$^7$ ................................ H05K 7/20
(52) U.S. Cl. .................. 361/695; 417/360; 417/423.14; 454/184
(58) Field of Search ............... 165/80.3, 121; 361/687, 694–695, 725–727; 417/360, 423.14; 454/184

(56) References Cited

U.S. PATENT DOCUMENTS

| | | | |
|---|---|---|---|
| 4,774,631 A | * 9/1988 | Okuyama et al. | 361/695 |
| 5,788,467 A | * 8/1998 | Zenitani et al. | 417/360 |
| 5,997,266 A | * 12/1999 | Lecinski et al. | 417/423.14 |
| 6,388,880 B1 | * 5/2002 | El-Ghobashy et al. | 361/695 |
| 6,457,949 B1 | * 10/2002 | Bendikas et al. | 417/360 |
| 6,592,449 B2 | * 7/2003 | Cipolla et al. | 454/184 |
| 6,625,020 B1 | * 9/2003 | Hanson et al. | 361/695 |

* cited by examiner

Primary Examiner—Greg D. Thompson
(74) Attorney, Agent, or Firm—Birch, Stewart, Kolasch & Birch, LLP

(57) ABSTRACT

A display circuit board is provided for a heat dissipation system. The heat dissipation system includes a fan tray, a control circuit board, a plurality of fans, and a display circuit board. The display circuit board includes a plurality of light emitting diodes (LEDs), a thermal sensor, and a connector. After the thermal sensor detects the temperature around the heat dissipation system and transmits a temperature signal to the control circuit board through a signal transmitting cable, the control circuit board adjusts the rotation speeds of the plurality of fans according to the temperature signal, and further transmits a plurality of display signals, which indicate the operation situation of the plurality of fans to the corresponding LEDs through the signal transmitting cable.

5 Claims, 3 Drawing Sheets

DISPLAY CIRCUIT BOARD OF A HEAT DISSIPATION SYSTEM

FIELD OF THE INVENTION

The invention relates to a display circuit board of a heat dissipation system, and more particularly, to a display circuit board that has a plurality of light emitting diodes soldered thereon.

BACKGROUND OF THE INVENTION

With constantly enhanced functions of electronic devices, the heat dissipation apparatus or system has become an indispensable accessory for these electronic devices. If the thermal energy generated by the electronic devices is not properly dissipated, they will suffer functional degradation, or even become damaged in serious situations. For instance, a computer generally has a heat dissipation system consisting of a plurality of fans for dissipating the thermal energy generated by the central processing unit or the power supply. The heat dissipation system must be connected to the control ports of the computer. The computer has a built-in detection circuit to detect the operating conditions of the fans. In the event that one of the fans malfunctions, the other fans in the heat dissipation system must be able to make up the lost heat dissipation power of the malfunctioned fan. Otherwise, the consequences could be serious. Hence the electronic devices that generate a great amount of heat (such as the central processing unit) usually have a heat dissipation apparatus or system located on the surface or side to dissipate the generated thermal energy.

Please refer to FIG. 1. FIG. 1 is a diagram of a heat dissipation system 10 according to the prior art. As shown in FIG. 1, the heat dissipation system 10 comprises a fan tray 12, a control circuit board 16 disposed on the fan tray 12, a plurality of fans 14 disposed on a bottom board 18 of the fan tray 12, and a plurality of light emitting diodes 20 disposed on a side wall of the fan tray 12. The fan tray 12 is a box-shaped metal frame having an opening 17, a bottom board 18 and four side walls. The fans 14 are vertically mounted onto the fan tray 12 through the opening 17 and are fastened to the bottom board 18 of the fan tray 12 by means of a plurality of fasteners (such as screws, etc.). Each fan 14 is electrically connected to the control circuit board 16 through a plurality of conductive cables 21 (such as power supply cables, signal cables, etc.). The light emitting diodes 20 are provided to display the operating conditions of the corresponding fans 14. Each light emitting diode 20 has a positive and a negative terminal connecting to the control circuit board 16 through a signal cable 23 to display the signal of the operating conditions of the corresponding fan 14 transmitted from the control circuit board 16.

When a user wishes to install the heat dissipation system 10 on a targeted heat dissipation object, the tangled conductive cables 21 and signal cables 23 reduce the usable space and increase the difficulty of installation. In the event that the targeted heat dissipation object requires greater heat dissipation, the heat dissipation system 10 needs more fans 14. That is, more light emitting diodes 20, conductive cables 21 and signals cable 23 are required. The problems mentioned above will become even more severe.

SUMMARY OF THE INVENTION

The object of the present invention is therefore to provide a display circuit board of a heat dissipation system that has a simple design, occupies less space and does not require complicated wiring to display the operating conditions of the heat dissipation system.

The foregoing, as well as additional objects, features and advantages of the invention will be more readily apparent from the following detailed description, which proceeds with reference to the accompanying drawings.

DESCRIPTION OF THE PREFERRED EMBODIMENT

Figure 1:
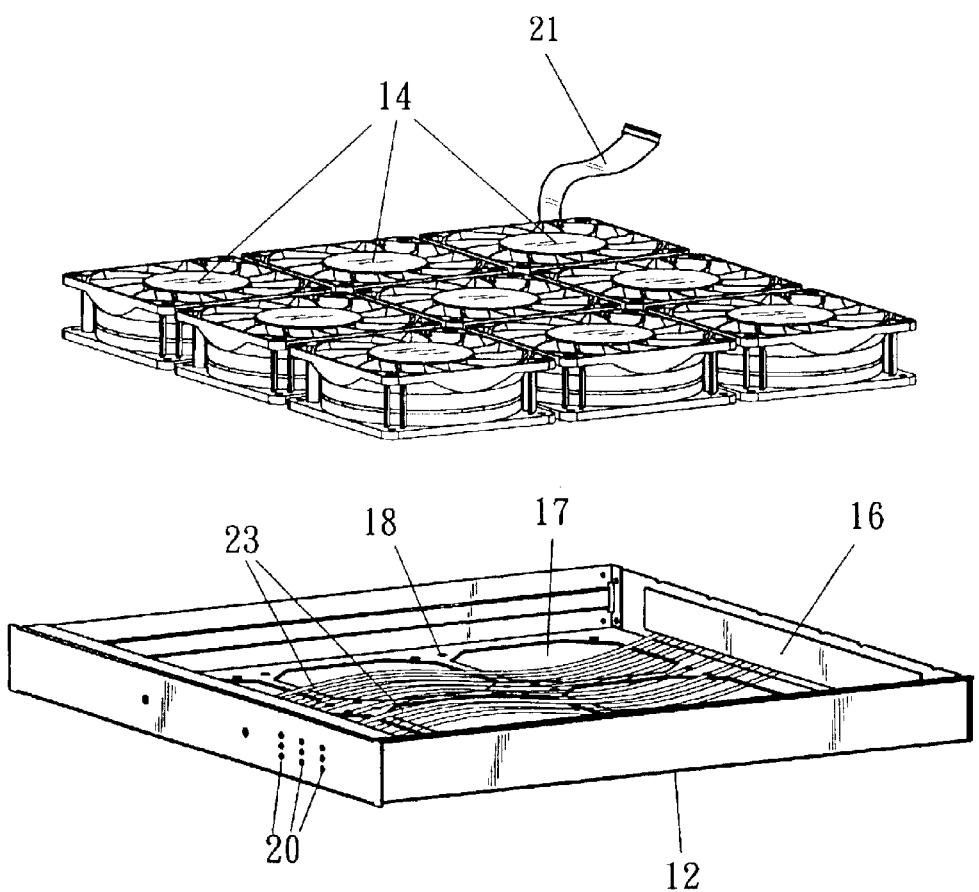
FIG. 1 is a diagram of a heat dissipation system according to the prior art.
Figure 2:
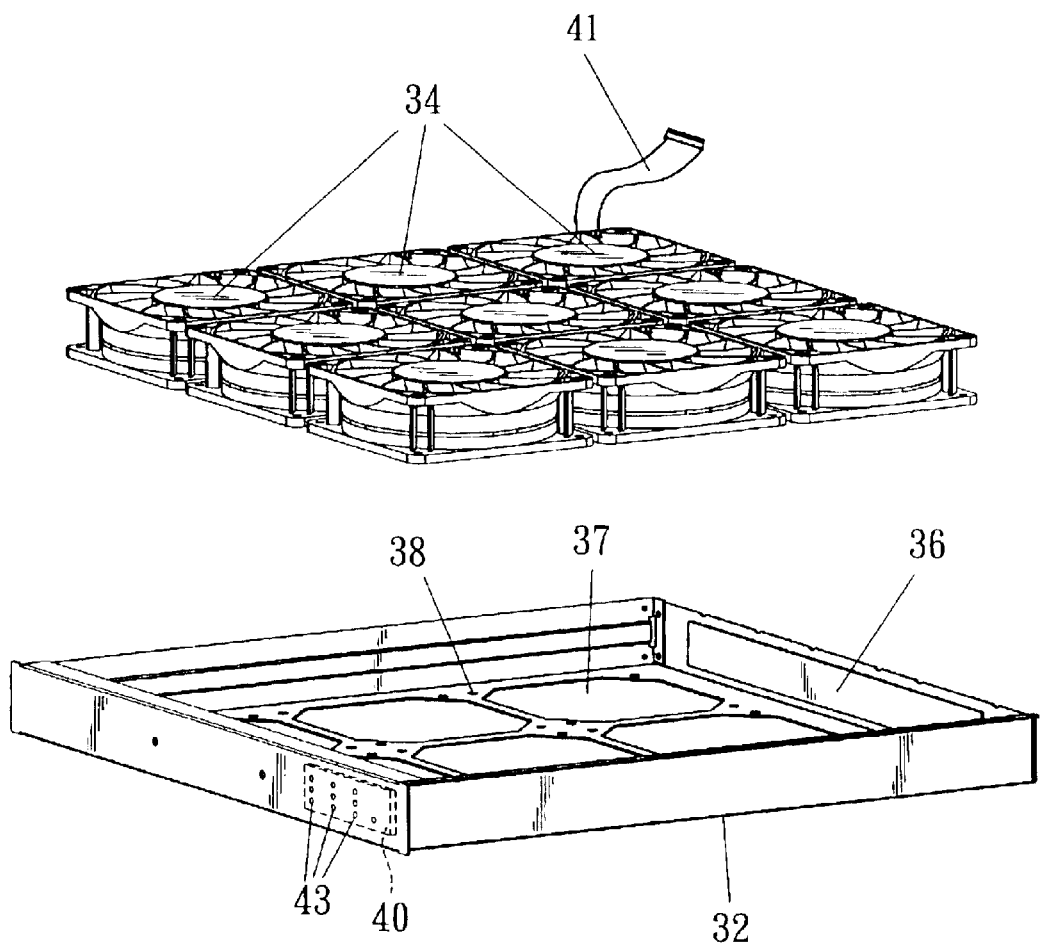
FIG. 2 is a diagram of a heat dissipation system according to the present invention.

Please refer to FIG. 2. FIG. 2 is a diagram of a heat dissipation system 30 according to the present invention. As shown in FIG. 2, the heat dissipation system 30 of the invention comprises a fan tray 32, a control circuit board 36 disposed on the fan tray 32 for controlling operations of the heat dissipation system 30, a plurality of fans 34 disposed on a bottom board 38 of the fan tray 32, and a display circuit board 40 disposed on one side wall of the fan tray 32. The fan tray 32 is a box-shaped metal frame having an opening 37, a bottom board 38 and four side walls. The fans 34 are vertically mounted onto the fan tray 32 through the opening 37 and are fastened to the bottom board 38 of the fan tray 32 by means of a plurality of fasteners (such as screws, etc.). Moreover, each fan 34 is electrically connected to the control circuit board 36 through a plurality of conductive cables 41 (such as power supply cables, signal cables, etc.) so that the control circuit board 36 can control the rotation speed of each fan 34 through the conductive cables 41, and rotation signals can be transmitted back to the control circuit board 36.

Figure 3:
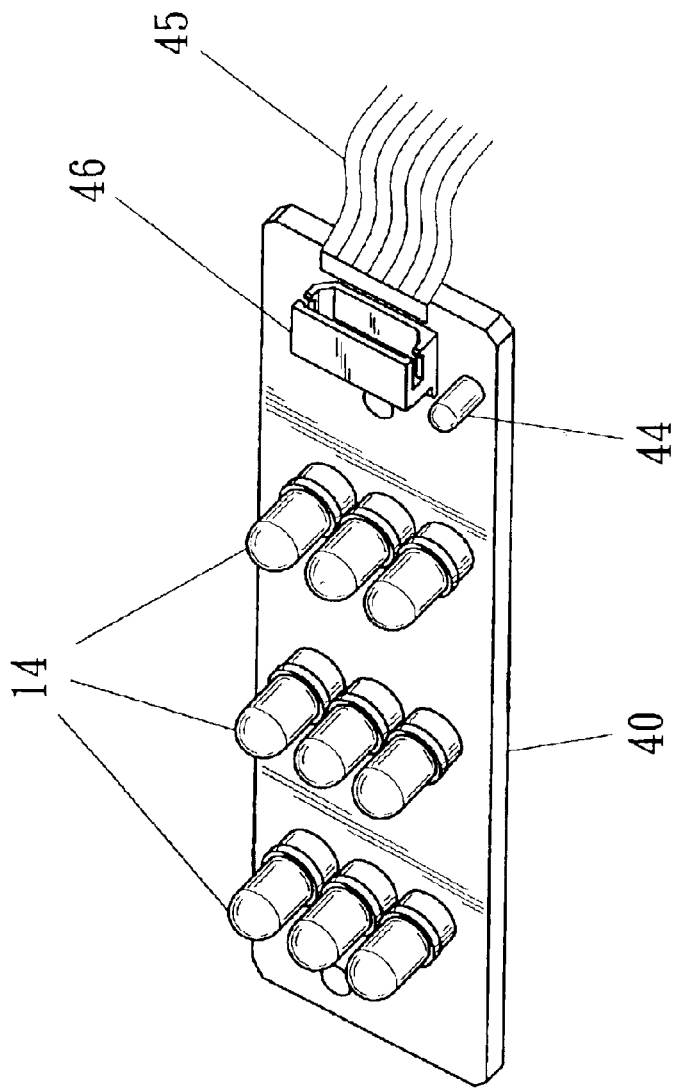
FIG. 3 is a diagram of a display circuit board shown in FIG. 2.

Please refer to FIGS. 2 and 3. FIG. 3 is a diagram of the display circuit board 40 shown in FIG. 2. As shown in FIG. 3, the display circuit board 40 comprises a plurality of light emitting diodes (LEDs) 42, a thermal sensor 44 and a connector 46, which are all soldered on the display circuit board 40. The light emitting diodes 42 display the operating conditions of each corresponding fan 34. The thermal sensor 44 detects the surrounding temperature of the heat dissipation system. Furthermore, the connector 46 connects to at least one signal transmitting cable 45 for transmitting signals between the display circuit board 40 and the control circuit board 36.

It should be noted that the number of light emitting diodes 42 on the display circuit board 40 corresponds to the number of fans 34 in the heat dissipation system 30. One side wall of the fan tray 32 has apertures 43 with the same number and size as those of the light emitting diodes 42 so that when the display circuit board 40 is fastened to the inner surface of the side wall of the fan tray 32 by means of fasteners such as screws, the light emitting diodes 42 and the thermal sensor 44 are exposed on the outer surface of the side wall and are visible from the outside.

When the thermal sensor 44 detects the surrounding temperature of the heat dissipation system 30, and transmits a temperature signal to the control circuit board 36 through the signal transmitting cable 45, the control circuit board 36 modulates the rotation speeds of the fans 34 based on the temperature signal. Meanwhile, the operating conditions of the fans 34 are transmitted through the signal transmitting cable 45 by means of a plurality of display signals to the corresponding light emitting diodes 42. In the event that any of the light emitting diodes 42 indicates that the corresponding fan 34 is not functioned properly, the control circuit board 36 modulates the rotation speed of the fan 34 to maintain the total heat dissipation effect of the heat dissipation system 30. Furthermore, the malfunctioning fan 34 may be replaced easily to prevent the signal cable from rupturing or being wrongly connected.

In contrast to the prior art, the main characteristic of the heat dissipation system 30 of the present invention is that the light emitting diodes 42 that are used for displaying the operating conditions of the system and the thermal sensor 44 which is used to detect the temperature surrounding the system are soldered on a display circuit board 40, which is simple and does not take much space. As a result, the tangled wiring of the light emitting diodes 42 and the problems of difficult installation and wrong signal cable connection that occur with the prior heat dissipation systems may be prevented, and space may be spared in the heat dissipation system.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A display circuit board of a heat dissipation system which includes a fan tray, a control circuit board disposed on the fan tray for controlling operations of the heat dissipation system, a plurality of fans disposed on a bottom board of the fan tray, and the display circuit board disposed on one side of the fan tray; the display circuit board comprising:

a plurality of light emitting diodes (LEDs) fixedly disposed on the display circuit board for displaying operating conditions of the heat dissipation system;

a thermal sensor fixedly disposed on the display circuit board for detecting the surrounding temperature of the heat dissipation system; and a connector fixedly disposed on the display circuit board connecting to at least one signal transmitting cable for transmitting signals between the display circuit board and the control circuit board;

wherein the thermal sensor detects the surrounding temperature of the heat dissipation system and through the signal transmitting cable transmits a temperature signal to the control circuit board which modulates the rotation speeds of the fans based on the temperature signal, operating conditions of the fans being transmitted through the signal transmitting cable by means of a plurality of display signals to the corresponding light emitting diodes.

2. The display circuit board of claim 1, wherein the light emitting diodes and the thermal sensor are fixedly soldered on the display circuit board.

3. The display circuit board of claim 1, wherein the display circuit board is fastened to an inner surface of the one side of the fan tray by means of at least one fastener.

4. The display circuit board of claim 3, wherein the light emitting diodes and the thermal sensor on the display circuit board are exposed on an outer surface of the one side of the fan tray.

5. The display circuit board of claim 1, wherein the fans are axial-flow fans.

* * * * *